(12) United States Patent
Kajiwara et al.

(10) Patent No.: US 10,494,734 B2
(45) Date of Patent: Dec. 3, 2019

(54) METHOD FOR PRODUCING SILICON SINGLE CRYSTALS

(71) Applicant: SUMCO CORPORATION, Tokyo (JP)

(72) Inventors: Kaoru Kajiwara, Tokyo (JP); Yasuhiro Saito, Tokyo (JP); Takahiro Kanehara, Tokyo (JP); Tomokazu Katano, Tokyo (JP); Kazumi Tanabe, Tokyo (JP); Hideki Tanaka, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 0 days.

(21) Appl. No.: 15/741,314

(22) PCT Filed: Jul. 6, 2016

(86) PCT No.: PCT/JP2016/069981
§ 371 (c)(1),
(2) Date: Jan. 2, 2018

(87) PCT Pub. No.: WO2017/033583
PCT Pub. Date: Mar. 2, 2017

(65) Prior Publication Data
US 2018/0187330 A1   Jul. 5, 2018

(30) Foreign Application Priority Data
Aug. 21, 2015 (JP) ................ 2015-163511

(51) Int. Cl.
C30B 15/00 (2006.01)
C30B 15/20 (2006.01)
C30B 29/06 (2006.01)

(52) U.S. Cl.
CPC .............. *C30B 15/20* (2013.01); *C30B 29/06* (2013.01)

(58) Field of Classification Search
CPC ......... C30B 15/00; C30B 15/10; C30B 15/14; C30B 15/20
See application file for complete search history.

(56) References Cited

U.S. PATENT DOCUMENTS 6,004,393 A   12/1999  Maeda et al.
6,340,390 B1   1/2002  Asano et al.
(Continued)

FOREIGN PATENT DOCUMENTS

CN   1824848 A   8/2006
JP   59-30792 A   2/1984
(Continued)

*Primary Examiner* — Robert M Kunemund
(74) *Attorney, Agent, or Firm* — Greenblum & Bernstein, P.L.C.

(57) ABSTRACT

A method for producing a plurality of silicon single crystals using a single quartz crucible by repeating a step of heating a silicon material charged in the quartz crucible within a chamber and a step of pulling a silicon single crystal from the silicon melt in the quartz crucible includes a first melting step of melting the silicon material fed to the quartz crucible used to pull a first silicon single crystal, and a second melting step of melting an additional amount of the silicon material fed to the quartz crucible used to pull the second and subsequent silicon single crystals. The interior of the chamber is set to be a first furnace pressure during the first melting step and then set to be a second furnace pressure higher than the first furnace pressure during the second melting step.

20 Claims, 2 Drawing Sheets

(56) References Cited

U.S. PATENT DOCUMENTS

2003/0051658 A1* 3/2003 Nakagawa .............. C30B 15/20
117/13
2006/0174817 A1 8/2006 Krautbauer et al.

FOREIGN PATENT DOCUMENTS

| JP | 62-260791 A | 11/1987 |
| JP | 10-291892 A | 11/1998 |
| JP | 2000-159596 A | 6/2000 |
| JP | 2000-169287 A | 6/2000 |
| JP | 2002-362996 A | 12/2002 |
| JP | 2004-83317 A | 3/2004 |
| JP | 2008-87996 A | 4/2008 |
| JP | 2010-018506 A | 1/2010 |

* cited by examiner

METHOD FOR PRODUCING SILICON SINGLE CRYSTALS

TECHNICAL FIELD

The present invention relates to a method for producing silicon single crystals using the Czochralski method (hereinafter referred to as "CZ method"). In particular, the present invention relates to a so-called "multi-pulling process" in which multiple silicon single crystals are produced in succession using the same quartz crucible.

BACKGROUND ART

The multi-pulling process is a known technique for producing silicon single crystals using the CZ method (See, Patent Document 1, for example). In the multi-pulling process, after a silicon single crystal has been pulled up, an additional amount of the silicon material is fed to the same quartz crucible to replenish the silicon and melted. From the resultant silicon melt, a subsequent silicon single crystal is pulled up. Such feeding and pulling steps are repeated to produce multiple silicon single crystals from the single quartz crucible. According to the multi-pulling process, it is possible to reduce the cost of the quartz crucible per each silicon single crystal produced. In addition, the process can reduce the frequency of disassembling the chamber to replace the quartz crucible, thereby improving the operation efficiency.

During the silicon single crystal production using the CZ method, a silicon material such as polycrystalline silicon is charged into a quartz crucible and melted by heating in a chamber. Subsequently, a seed crystal mounted on the lower end of a pulling rod is descended from above the quartz crucible and dipped in the silicon melt. The seed crystal is then slowly lifted upward while rotating the seed crystal and the quartz crucible in predetermined directions, thus resulting in the growth of a single crystal underneath the seed crystal.

The chamber is maintained under reduced pressure during the growth of the silicon single crystal. While the silicon melt is supersaturated with oxygen dissolved from the quartz crucible, the gas flow rate is slowed when the pressure inside the chamber (furnace pressure) is high. As a result, a significant amount of evaporated SiO is deposited inside the chamber, which may fall in the silicon melt as SiO powder and cause dislocations. However, the occurrence of dislocation can be minimized by decreasing the furnace pressure so that the generated gas can be effectively discharged from the furnace.

In order to solve the problem of dislocations in single crystals caused by the evaporation of SiO and by the formation of pinholes, Patent Document 2 describes a method for controlling a furnace pressure in which the furnace pressure during the melting step is maintained at from 65 to 400 mbar and the furnace pressure during the pulling step is maintained lower than that and 95 mbar or below. Also, Patent Document 3 describes a method for controlling a furnace pressure in which the furnace pressure during the first half of the melting step is maintained at a higher pressure (60 to 400 mbar) and the furnace pressure during the second half of the melting step is maintained at a lower pressure (60 mbar or below). Further, Patent Document 4 describes a method for preventing pinhole defects in a silicon single crystal in which the furnace pressure during melting of the material is maintained at a low pressure below 60 hPa to facilitate the volatilization of the gas dissolved in the silicon melt.

CITATION LIST

Patent Document

[Patent Document 1] Japanese Patent Application Laid-Open No. 2010-018506 A
[Patent Document 2] Japanese Patent Application Laid-Open No. 2000-169287 A
[Patent Document 3] Japanese Patent Application Laid-Open No. 2002-362996 A
[Patent Document 4] Japanese Patent Application Laid-Open No. 2000-159596 A

SUMMARY OF THE INVENTION

Problems to be Solved by the Invention

As described above, the multi-pulling method has significant advantages in terms of both production efficiency of silicon single crystals and manufacturing cost. The method for preventing pinhole defects in a silicon single crystal by maintaining low furnace pressure during melting of the material is also effective in the multi-pulling method.

Nonetheless, carbon heaters and various other carbon members arranged in the chamber tend to produce CO gas as they wear under high temperature environment during the growth step. As a result, during the multi-pulling process, the silicon melt is progressively contaminated with carbon and the carbon concentration in resulting silicon single crystals correspondingly increases as more silicon single crystals are pulled from the silicon melt. Specifically, as the second and subsequent silicon single crystals are successively pulled, CO gas is adsorbed onto the unmolten silicon material, dissolved into the silicon melt during melting, and incorporated into the silicon single crystal during the growth. As a result, the second and the subsequent silicon single crystals tend to contain higher concentrations of carbon than the first silicon single crystal. Such a phenomenon becomes particularly significant when the furnace pressure is maintained low during melting of the material in order to prevent the pinhole defects in the silicon single crystals.

Means for Solving the Problems

It is therefore an objective of the present invention to provide a method for producing silicon single crystals that can reduce the carbon concentration in the second and subsequent silicon single crystals produced during the multi-pulling process, while preventing pinhole defects in the silicon single crystals.

To solve the above-identified problems, a method for producing silicon single crystals in accordance with the present invention comprises producing a plurality of silicon single crystals using a single quartz crucible by repeating a step of heating a silicon material charged in the quartz crucible within a chamber with a heater to melt the silicon material and a step of pulling a silicon single crystal from the silicon melt in the quartz crucible, the method comprising a first melting step of melting the silicon material fed to the quartz crucible used to pull a first silicon single crystal, and a second melting step of melting an additional amount of the silicon material fed to the quartz crucible used to pull the second and subsequent silicon single crystals, the method being characterized in that the interior of the chamber is set to be a first furnace pressure during the first melting step, and the interior of the chamber is set to be a second furnace pressure higher than the first furnace pressure during the second melting step.

According to the present invention, the increase in the carbon concentration in the silicon melt formed by melting the additional amount of the silicon material (recharge material) fed to pull the second and subsequent silicon single crystals can be minimized while preventing pinhole defects in the silicon single crystals. As a result, high-quality silicon single crystals with low carbon concentrations can be produced.

In the present invention, it is preferred that the second furnace pressure is higher than the first furnace pressure by 40 Torr or more. It is also preferred that the second furnace pressure is twice the first furnace pressure or higher. When the second furnace pressure is kept higher than the first furnace pressure as indicated above, the increase in the carbon concentration in the silicon melt can be sufficiently suppressed and the carbon concentration in the growing silicon single crystals can be minimized.

In the present invention, the flow rate of inert gas fed into the chamber is preferably set to be a first flow rate during the first melting step, and the flow rate of inert gas fed into the chamber is preferably set to be a second flow rate lower than the first flow rate during the second melting step. In this case, the inert gas is preferably argon gas and the second flow rate is preferably lower than the first flow rate by as much as 50 L/min or more. By setting the second flow rate to be smaller than the first flow rate, it is possible to stably control the second furnace pressure. Also, the lower second flow rate helps to prevent the decrease in the productivity due to the increased influx of inert gas into the chamber, which would cool down the silicon material, thereby making it take longer to melt the material.

Advantages of the Invention

As described, the present invention can provide a method for producing silicon single crystals that achieves reduction of the carbon concentration in the second and subsequent silicon single crystals during the multi-pulling process while preventing pinhole defects in the silicon single crystals.

DETAILED DESCRIPTION OF THE EMBODIMENTS

Preferred embodiments of the present invention will now be described in detail below with reference to the accompanying drawings.

Figure 1:
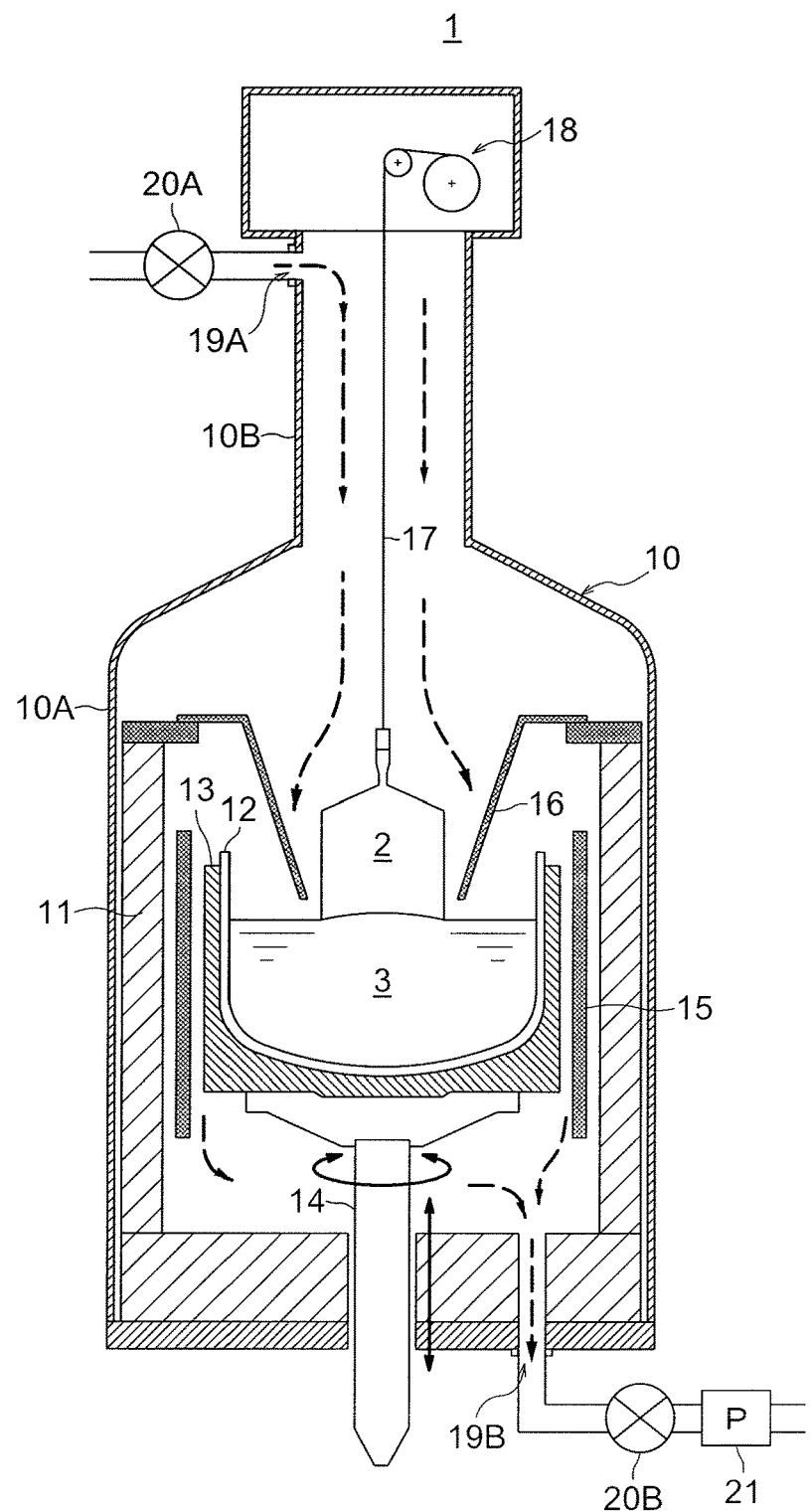
FIG. 1 is a longitudinal cross-sectional view showing a construction of a silicon single crystal pulling apparatus according to an embodiment of the present invention.

FIG. 1 is a longitudinal cross-sectional view showing a construction of a silicon single crystal pulling apparatus according to an embodiment of the present invention.

As shown in FIG. 1, the silicon single crystal pulling apparatus 1 includes a chamber 10, a thermal insulating material 11 arranged along the inner surface of the chamber 10, a quartz crucible 12 arranged at the center of the chamber 10, a carbon susceptor 13 supporting the quartz crucible 12, a rotary support shaft 14 supporting the susceptor 13 in such a manner that it can move the susceptor 13 upward and downward, a heater 15 arranged about the susceptor 13, a heat-shielding body 16 having a schematically inverted conical-shape and arranged above the susceptor 13, a single crystal pulling wire 17 arranged above the susceptor 13 and aligned with the rotary support shaft 14, and a wire winding mechanism 18 arranged above the chamber 10.

The chamber 10 consists of a main chamber 10A and an elongate cylindrical pull chamber 10B connected to the upper opening of the main chamber 10A. The above-described quartz crucible 12, susceptor 13, rotary support shaft 14, heater 15 and heat-shielding body 16 are provided in the main chamber 10A. The heater 15 is used to melt a silicon material charged in the quartz crucible 12 to generate silicon melt. The heater 15 is a resistive carbon heater and surrounds the quartz crucible 12 within the susceptor 13.

The heat-shielding body 16 is made of carbon and is arranged so as to surround a silicon single crystal 2 growing above the silicon melt 3. The wire winding mechanism 18 is arranged above the pull chamber 10B and the wire 17 extends downward from the wire winding mechanism 18 through the pull chamber 10B with the tip of the wire 17 reaching the interior space of the main chamber 10A. FIG. 1 illustrates the silicon single crystal suspended by the wire 17 during growing.

In manufacturing silicon single crystals using the construction above, the quartz crucible 12 with the silicon material charged therein is positioned within the susceptor 13. A seed crystal is mounted at the tip of the wire 17. The silicon material in the quartz crucible 12 is then heated with the heater 15 to generate the silicon melt 3.

During the pulling step of the silicon single crystal, the seed crystal is descended and dipped in the silicon melt 3. Subsequently, the seed crystal is slowly lifted upward while the seed crystal and the quartz crucible 12 are individually rotated. This causes a generally cylindrical silicon single crystal 2 to grow underneath the seed crystal. During this process, the diameter of the silicon single crystal 2 can be controlled by controlling the speed at which the crystal is pulled and the power of the heater 15.

A gas inlet 19A is provided at the top of the pull chamber 10B for introducing argon gas into the chamber 10, and a gas outlet 19B is provided at the bottom of the main chamber 10A for discharging argon gas from within the chamber 10. The amount of the argon gas introduced from the gas inlet 19A into the chamber 10 can be controlled by a butterfly valve 20A. Since the argon gas within the sealed chamber 10 is discharged through the gas outlet 19B to the outside of the chamber, SiO gas and CO gas inside the chamber 10 can be collected to keep the interior of the chamber 10 clean. A butterfly valve 20B and a vacuum pump 21 are located in the piping connected to the gas outlet 19B. The flow rate of the argon gas can be controlled by the butterfly valve 20B while the vacuum pump 21 sucks argon gas from within the chamber 10. In this manner, the interior of the chamber 10 is kept under constant reduced pressure.

Figure 2:
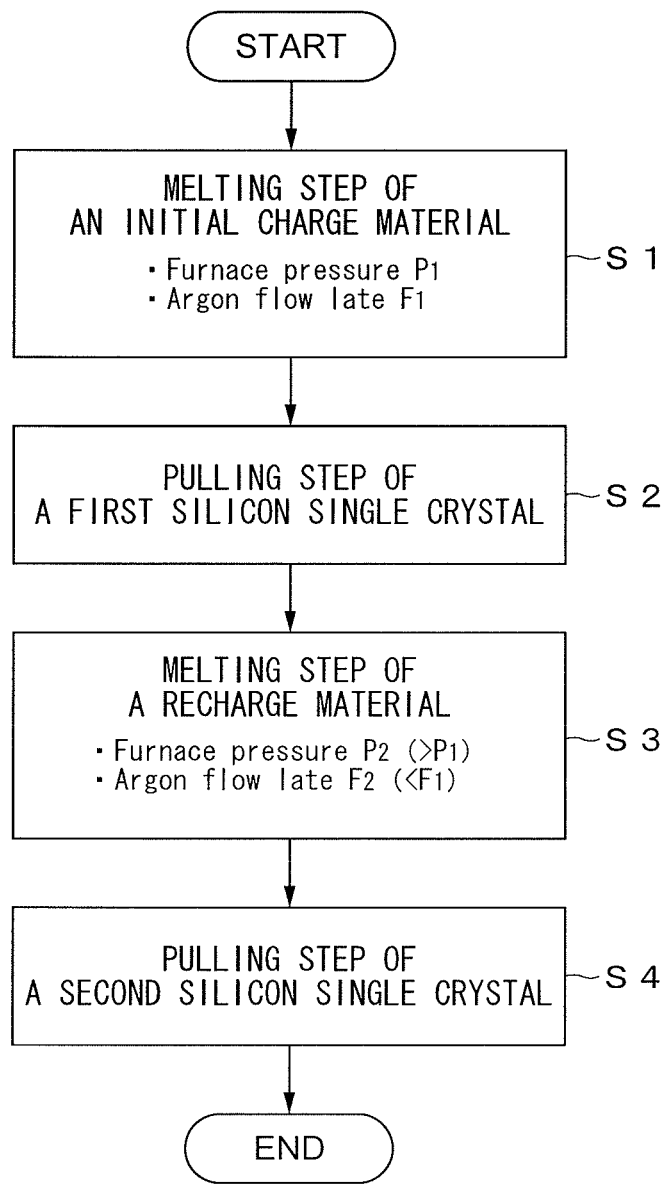
FIG. 2 is a flowchart illustrating a production process of silicon single crystals according to an embodiment of the present invention.

FIG. 2 is a flowchart illustrating a production process of silicon single crystals according to an embodiment of the present As shown in FIG. 2, to grow a first silicon single crystal in the multi-pulling process, a solid silicon material, such as polycrystalline silicon, which is charged into a quartz crucible 12 as an initial charge (i.e. initial charge material), is melted to generate a silicon melt 3 (Step S1). During this, the furnace pressure $P_1$ (first furnace pressure) inside the chamber 10 is set to be, for example, 40 Torr and the flow rate $F_1$ (first flow rate) of argon gas fed into the chamber 10 is set to be, for example, 250 L/min.

Subsequently, a first silicon single crystal 2 is pulled up from the silicon melt 3 (Step S2). The furnace pressure provided during the pulling process is preferably lower than the furnace pressure provided during the melting process ($P_1$).

Following this, a second silicon single crystal 2 is grown. To this end, an additional amount of the silicon material is fed to the quartz crucible 12 and melted to generate the silicon melt 3 (Step S3). During this, the furnace pressure $P_2$ (second furnace pressure) inside the chamber 10 is set to be higher than the furnace pressure $P_1$ provided during melting of the initial charge material for the growth of the first silicon single crystal. Also, the flow rate $F_2$ (second flow rate) of argon gas fed into the chamber 10 is set to be less than the flow rate $F_1$ provided during melting of the initial charge material for the growth of the first silicon single crystal. Specifically, the furnace pressure P, in the chamber 10 is set to be 80 Torr or higher and the flow rate $F_2$ of argon gas is set to be 200 L/min or less. In short, the furnace pressure $P_2$ is preferably higher than the furnace pressure $P_1$ by as much as 40 Torr or more, or it is preferably twice the furnace pressure $P_1$ or higher. Also, the flow rate $F_2$ is preferably lower than the flow rate $F_1$ by as much as 50 L/min or more.

Subsequently, the second silicon single crystal 2 is pulled up from the silicon melt 3 (Step S4). As described above, the furnace pressure provided during the pulling step is lower than the furnace pressure ($P_2$) provided during the melting step.

The reason that the furnace pressure $P_2$ provided during melting of the additional amount of the silicon material (recharge material) to pull the second silicon single crystal is kept higher than the furnace pressure $P_1$ for the first silicon single crystal is to prevent the CO gas present in the chamber 10 from dissolving in the silicon melt 3 to cause an increase in the carbon concentration in the silicon single crystal. CO gas is generated in the chamber 10 as a result of wearing of the carbon heater 15, the heat-shielding body 16, the susceptor 13 or the like. This CO gas is adsorbed onto the solid recharge material and is dissolved in the silicon melt upon melting of the material, thus causing an increase in the carbon concentration in the silicon melt. However, the diffusion of the CO gas into the surface of the silicon melt can be minimized and thus the incorporation of CO gas into the silicon melt can be minimized by increasing the furnace pressure during the melting step of the recharge material. As a result, the increase in the carbon concentration in the silicon single crystal grown from the silicon melt can be minimized.

On the other hand, the reason the furnace pressure $P_1$ provided during the melting step of the silicon material that has been fed to pull the first silicon single crystal (initial charge material) (First melting step) is kept low is to prevent pinhole defects in the silicon single crystal. Pinhole defects occur during melting of the material when the gas adsorbed onto the bottom of the quartz crucible 12 is released from the bottom, floats upward in the silicon melt, and is eventually incorporated into the growing silicon single crystal. For this reason, it is preferred to keep the furnace pressure low during milting of the initial charge material.

When the additional amount of the recharge material is fed, some of the silicon melt still remains in the quartz crucible 12 and thus, air bubbles are not generated at the bottom of the quartz crucible 12. For this reason, pinhole defects will not occur if the furnace pressure is increased during the melting step of the recharge material (Second melting step). In contrast, if the furnace pressure is low during melting of the recharge material, the CO gas present in the chamber can readily dissolve in the silicon melt and cause an increase in the carbon concentration in the silicon melt. Accordingly, the multi-pulling process according to the present embodiment involves controlling the furnace pressure by increasing the furnace pressure only during melting of the recharge material while maintaining the furnace pressure low during melting of the initial charge material.

As described above, the flow rate $F_2$ of argon gas during the melting step of the additional charge material is set to be lower than the flow rate $F_1$ of argon gas during the melting step of the initial charge material. If the furnace pressure is changed to during the melting step of the initial charge material while the flow rate $F_1$ is maintained high, the controllability of the butterfly valves 20A, 20B adapted to control the flow rate of argon gas may be lost and the furnace pressure may become unstable. Also, the argon gas flow in the chamber 10 may become fast to cause a vortex, which in turn may increase the diffusion of CO gas into the surface of the silicon melt. Furthermore, the increased influx of argon gas into the chamber 10 may cool the silicon material. As a result, the melting step may be prolonged and the productivity may be decreased. Decreasing the argon gas flow rate $F_2$ as described can stabilize the furnace pressure and minimize the diffusion of CO gas into the surface of the silicon melt, thereby increasing the productivity.

The third and subsequent silicon single crystals may also be grown in the same fashion as the second silicon single crystal by repeating the melting step (second melting step, collectively refers to the melting steps for the second and subsequent silicon single crystals) and the pulling step. Specifically, also in growing the third and subsequent silicon single crystals, the furnace pressure during melting of the recharge material ($P_3$) is set to be higher than the furnace pressure during melting of the initial charge material ($P_1$) and the argon gas flow rate ($F_3$) is set to be lower than the argon gas flow rate during melting of the initial charge material ($F_1$). In such a case, the furnace pressure during melting of the recharge material may be progressively increased to correspond to the increasing number of the silicon single crystals to be pulled ($P_1 < P_2 < P_3 \ldots < P_n$)

As described, since the method for producing silicon single crystals according to the present embodiment uses a higher furnace pressure during melting of an additional amount of the silicon material (recharge material) fed to pull the second and subsequent silicon single crystals than the furnace pressure provided during melting of the silicon material fed to pull the first silicon single crystal (initial charge material), the increase in the carbon concentration in the silicon melt can be minimized. Thus, the method enables production of high-quality silicon single crystals with low carbon concentrations.

While preferred embodiments of the present invention have been explained above, the present invention is not limited thereto.

Various modifications can be made to the embodiments without departing from the scope of the present invention and it is needless to say that such modifications are also embraced within the scope of the invention.

For example, while argon gas is used in the above-described embodiment as the inert gas introduced into the chamber 10, other inert gases may also be used.

REFERENCE SIGNS LIST 1 silicon single crystal pulling apparatus
2 silicon single crystal 3 silicon melt
10 chamber
10A main chamber
10B pull chamber
11 thermal insulating material
12 quartz crucible
13 susceptor
14 rotary support shaft
15 heater
16 heat-shielding body
17 wire
18 wire winding mechanism
19A gas inlet
19B gas outlet
20A, 20B butterfly valve
21 vacuum pump
$F_1$, $F_2$ flow rate of argon gas
$P_1$, $P_2$ furnace pressure

What is claimed is:

1. A method for producing silicon single crystals comprising producing a plurality of silicon single crystals using a single quartz crucible by repeating heating a silicon material charged in the quartz crucible within a chamber with a heater to melt the silicon material and pulling a silicon single crystal from a silicon melt in the quartz crucible, the method comprising:
   first melting the silicon material fed to the quartz crucible and used to pull a first silicon single crystal;
   first pulling the first silicon single crystal;
   second melting an additional amount of the silicon material fed to the quartz crucible in which a part of the silicon melt used to pull the first silicon single crystal still remains and used to pull a second and subsequent silicon single crystals; and
   second pulling the second and subsequent silicon single crystals, wherein
   during the first melting, an interior of the chamber is set to be a first furnace pressure,
   during the first pulling, the interior of the chamber is set to be a furnace pressure lower than the first furnace pressure,
   during the second melting, the interior of the chamber is set to be a second furnace pressure higher than the first furnace pressure, and
   during the second pulling, the interior of the chamber is set to be a furnace pressure lower than the second furnace pressure.

2. The method for producing silicon single crystals as claimed in claim 1, wherein the second furnace pressure is higher than the first furnace pressure by 40 Torr or more.

3. The method for producing silicon single crystals as claimed in claim 1, wherein the second furnace pressure is twice the first furnace pressure or higher.

4. The method for producing silicon single crystals as claimed in claim 1, wherein
   a flow rate of inert gas fed into the chamber is set to be a first flow rate during the first melting, and
   the flow rate of inert gas fed into the chamber is set to be a second flow rate lower than the first flow rate during the second melting.

5. The method for producing silicon single crystals as claimed in claim 4, wherein the second flow rate is lower than the first flow rate by 50 L/min or more.

6. The method for producing silicon single crystals as claimed in claim 4, wherein the inert gas is argon gas.

7. The method for producing silicon single crystals as claimed in claim 2, wherein the second furnace pressure is twice the first furnace pressure or higher.

8. The method for producing silicon single crystals as claimed in claim 2, wherein
   a flow rate of inert gas fed into the chamber is set to be a first flow rate during the first melting, and
   the flow rate of inert gas fed into the chamber is set to be a second flow rate lower than the first flow rate during the second melting.

9. The method for producing silicon single crystals as claimed in claim 3, wherein
   a flow rate of inert gas fed into the chamber is set to be a first flow rate during the first melting, and
   the flow rate of inert gas fed into the chamber is set to be a second flow rate lower than the first flow rate during the second melting.

10. The method for producing silicon single crystals as claimed in claim 7, wherein
    a flow rate of inert gas fed into the chamber is set to be a first flow rate during the first melting, and
    the flow rate of inert gas fed into the chamber is set to be a second flow rate lower than the first flow rate during the second melting.

11. The method for producing silicon single crystals as claimed in claim 8, wherein the second flow rate is lower than the first flow rate by 50 L/min or more.

12. The method for producing silicon single crystals as claimed in claim 9, wherein the second flow rate is lower than the first flow rate by 50 L/min or more.

13. The method for producing silicon single crystals as claimed in claim 10, wherein the second flow rate is lower than the first flow rate by 50 L/min or more.

14. The method for producing silicon single crystals as claimed in claim 5, wherein the inert gas is argon gas.

15. The method for producing silicon single crystals as claimed in claim 8, wherein the inert gas is argon gas.

16. The method for producing silicon single crystals as claimed in claim 9, wherein the inert gas is argon gas.

17. The method for producing silicon single crystals as claimed in claim 10, wherein the inert gas is argon gas.

18. The method for producing silicon single crystals as claimed in claim 1, wherein during the second melting, setting the interior of the chamber to be the second furnace pressure reduces carbon concentration in the second and subsequent silicon single crystals.

19. The method for producing silicon single crystals as claimed in claim 2, wherein during the second melting, setting the interior of the chamber to be the second furnace pressure reduces carbon concentration in the second and subsequent silicon single crystals.

20. The method for producing silicon single crystals as claimed in claim 3, wherein during the second melting, setting the interior of the chamber to be the second furnace pressure reduces carbon concentration in the second and subsequent silicon single crystals.

* * * * *